(12) United States Patent
Toyoda et al.

(10) Patent No.: US 6,333,544 B1
(45) Date of Patent: Dec. 25, 2001

(54) INTEGRATED PHOTO SENSOR (75) Inventors: Inao Toyoda, Okazaki; Yoshitaka Gotoh, Toyotake, both of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/625,867

(22) Filed: Jul. 26, 2000

(30) Foreign Application Priority Data

Aug. 19, 1999 (JP) .................................................. 11-232972

(51) Int. Cl.[7] .................................................. H01L 27/14
(52) U.S. Cl. .................................................. 257/431
(58) Field of Search .................................. 257/431, 432, 257/433, 434, 435, 436, 552, 555

(56) References Cited

FOREIGN PATENT DOCUMENTS

| 8-32045 | 2/1996 | (JP) . |
| 8-32545 | * 2/1996 | (JP) . |
| 10-289994 | 10/1998 | (JP) . |

* cited by examiner

Primary Examiner—Keith Christianson
(74) Attorney, Agent, or Firm—Law Office of David G. Posz (57) ABSTRACT

A sensor portion of an integrated photo sensor is composed of a silicon substrate, a photo diode and a signal processing element which are provided on the silicon substrate separately from each other. A shading film is provided on a surface region of the substrate except a region above the photo diode, and an intermediate insulating film made of silicon oxide is provided between the silicon substrate and the shading film. The intermediate insulating film includes a part extending on a light-receiving region of the photo diode, and the part is covered with light transmittable gel having a refractive index approximately equal to that of the intermediate insulating film.

16 Claims, 7 Drawing Sheets

INTEGRATED PHOTO SENSOR

CROSS REFERENCE TO RELATED APPLICATION

This application is based upon and claims the benefit of Japanese Patent Application No. 11-232972 filed on Aug. 19, 1999, the contents of which are incorporated herein by reference.

BACKGROUND OF THE INVENTION

1. Field of the Invention

This invention relates to an integrated photo sensor provided by integrating a light-receiving element and elements for a signal processing circuit on a semiconductor substrate.

2. Description of the Related Art

JP-A-10-289994 proposes an integrated photo sensor. The photo sensor has a light-receiving element and signal processing circuit elements that are integrated on one chip, and a shading film for selectively determining a light-receiving region on the chip surface. It is considered that this structure reduces the chip size as small as possible for the integration, and prevents erroneous operations of the signal processing circuit elements ascribed to light incident on the elements. This kind of sensor is generally covered with a protective film made of resin such as silicone gel or the like for protection.

Specifically, the shading film covers a region other than the light-receiving element, and an insulating film (intermediate insulating film) such as a silicon oxide film underlies the shading film to assure electrical insulation from each of the signal processing circuit elements (each element for a digital circuit, an analog circuit, adjustment, or the like).

If the intermediate insulating film exists on the light-receiving element, however, optical characteristics vary due to interference of light in accordance with wavelength of light. To prevent this variation in optical characteristics, the intermediate insulating film is removed not to exist on the light-receiving element. The removal of the intermediate insulating film, however, increases the manufacturing cost. In addition, in this case, a protective film is disposed on the light-receiving element, which can vary sensor sensitivity.

JP-A-8-32045 discloses another integrated photo sensor. In the photo sensor, an intermediate insulating film remains on a light-receiving element. Further, a film (an oxide film formed by plasma CVD, and hereinafter referred to as a P—$SiO_2$ film) having a refractive index close to that of the intermediate insulating film is disposed on the intermediate insulating film provided on the light-receiving element so that light is restricted from being reflected at the interface between the P—$SiO_2$ film and the intermediate insulating film.

In this structure, since the thickness of the P—$SiO_2$ is thin, the reflection of light at the interface can be prevented effectively as compared to a case where a SiN film having a largely differing refractive index is left on the light-receiving element. However, since it is difficult to eliminate the effects by interference, the variation in optical characteristics is not prevented sufficiently.

SUMMARY OF THE INVENTION

The present invention has been made in view of the above problems. An object of the present invention is to provide an integrated photo sensor that is manufactured readily and can effectively restrict variation in optical characteristics produced due to interference of light.

According to the present invention, an integrated photo sensor has a light-receiving element and a signal processing circuit element that are provided on one chip. A shading film is provided on the chip to cover the signal processing element and not cover the light-receiving element. An intermediate insulating film is provided not only on the signal processing circuit through the shading film but also on the light-receiving element. Further, a light transmittable gel having a refractive index approximately equal to that of the intermediate insulating film is provided on the light-receiving element through the intermediate insulating film.

The light transmittable gel can be thickened sufficiently for preventing interference of light. Therefore, optical characteristics of the photo sensor are hardly affected by variation in thickness of the light transmittable gel. Further, since the intermediate insulating film can be thickened, the optical characteristics are hardly affected by variation in thickness of the intermediate insulating film. The intermediate insulating film needs not be removed from the surface of the light-receiving element.

BRIEF DESCRIPTION OF THE DRAWINGS

Other objects and features of the present invention will become more readily apparent from a better understanding of the preferred embodiment described below with reference to the following drawings, in which.

DETAILED DESCRIPTION OF THE PREFERRED EMBODIMENT

Figure 1:
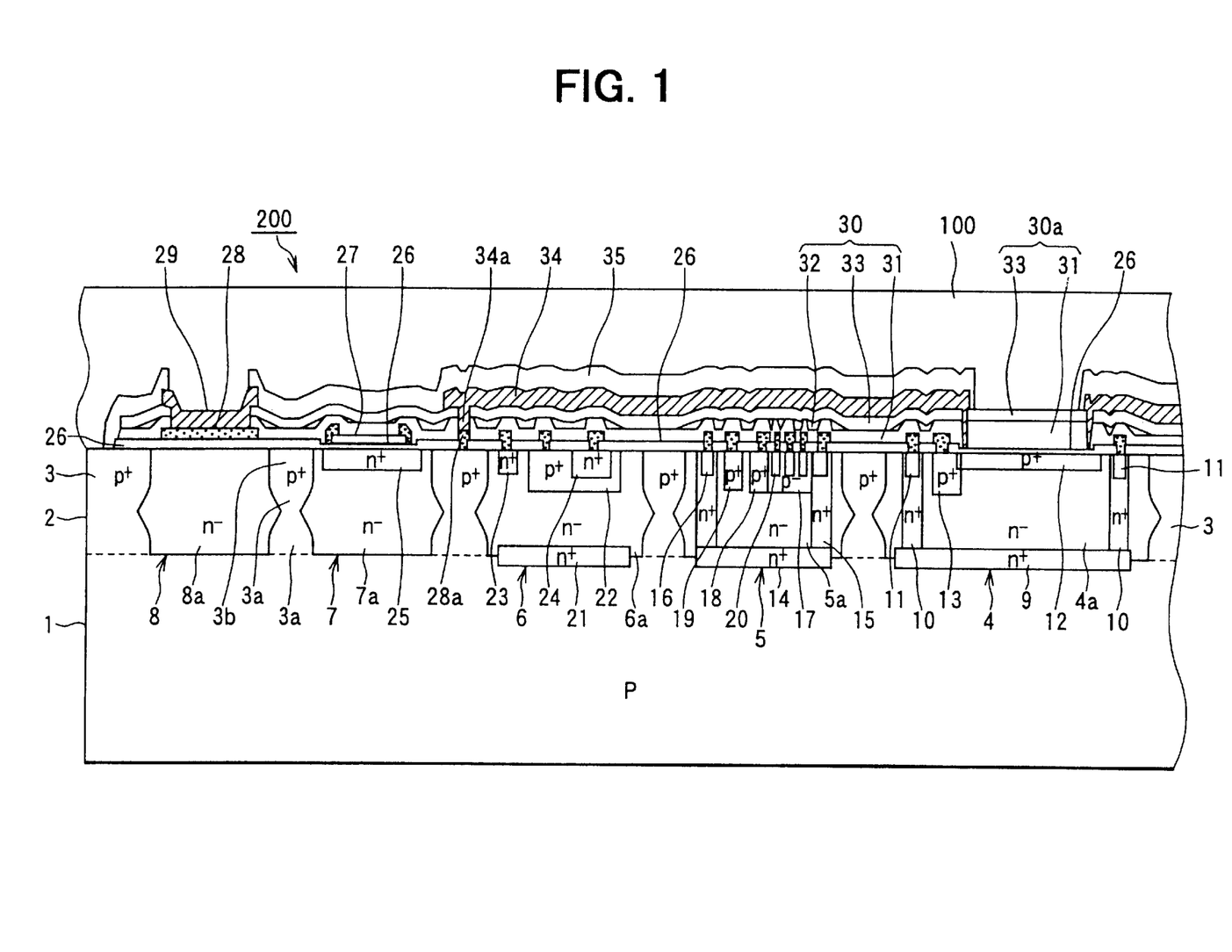
FIG. 1 is a cross-sectional view showing a main part of an integrated photo sensor in a preferred embodiment of the present invention.

A preferred embodiment according to the present invention is explained below with reference to the appended drawings. FIG. 1 shows a sensor portion 200 being a main part of an integrated photo sensor according to the present embodiment.

Referring to FIG. 1, a semiconductor substrate 1 is a p type silicon substrate (chip) having a (100) plane orientation. In the figure, a high concentration region is indicated with p+ or n+, while a low concentration region is indicated with p− or n−. A low concentration n type epitaxial layer 2, which corresponds to a region indicated with a broken line in FIG. 1) is provided on the silicon substrate 1. A high concentration p type isolating diffusion region 3 is provided at a periphery of the epitaxial layer 2 to isolate element formation regions from one another.

The isolating diffusion layer 3 is composed of two p type regions 3a and 3b connected to each other. The p type region 3a is formed by forming an impurity layer to be embedded in the substrate 1 before the epitaxial layer 2 is formed, and by thermally diffusing the impurity layer upward. The p type region 3b is formed by thermally diffusing impurities downward from the upper side after the epitaxial layer 2 is formed.

When the epitaxial layer 2 is formed, high concentration n type impurity regions are embedded in some of the element formation regions as needed. The high concentration n type impurity regions serve as low resistance regions that make flow of current in a lateral direction easier after elements are formed. In the element formation regions, as described below, a photo diode 4 as a light-receiving element, a IIL element 5 as a digital circuit element, a bipolar transistor 6 as an element for an analog circuit, a thin film resistor element 7 as a circuit element for adjustment, and other various circuit elements such as a diffusion resistor, a capacitor, and a diode, and an electrode pad 8 are formed.

The photo diode 4 is provided in an element formation region 4a formed isolatedly in the epitaxial layer 2. In the element formation region 4a, a high concentration n type embedded diffusion region 9 is formed at the interface portion with the substrate 1, and a high concentration n type region 10 is provided at a peripheral portion of the diffusion region 9, which continuously extends to the surface. A high concentration n type region 11 for contact is formed in the surface portion of the n type region 10. A high concentration p type region 12 is formed at an inner side of the element formation region 4a to constitute a pn junction as a light receiving part. A high concentration p type diffusion region 13 for contact is formed at an end of the diffusion region 12.

The IIL element 5 is provided in an element formation region 5a that is isolatedly formed in the epitaxial layer 2. In the element formation region 5a, a high concentration n type embedded diffusion region 14 is formed at the interface portion with the substrate 1, and a high concentration n type region 15 is provided at the peripheral portion of the diffusion region 14 and continuously extends to the surface. A high concentration n type region 16 for contact is formed in the surface portion of the n type region 15. At the inner side of the element formation region 5a, a low concentration p type base layer 17 and a high concentration p type region 18 for providing electrical contact to the base layer 17 are provided in the surface portion, and further, a high concentration p type injector layer 19 is provided. Three high concentration n type emitter layers 20 are formed in the base layer 17.

The bipolar transistor 16 is formed in an element formation region 6a that is isolatedly formed in the epitaxial layer 2. In the element formation region 6a, a high concentration n type embedded diffusion region 21 is formed at the interface portion with the substrate 1. Further, a high concentration p type base region 22 and a high concentration n type collector region 23 are formed in the surface portion. A high concentration n type emitter region 24 is formed in the base region 21.

The thin film resistor element 7 is formed in an element formation region 7a that is isolatedly formed in the epitaxial layer 2. A high concentration n type region 25 is formed in the surface portion of the element formation region 7a. Further, a thin film resistor 27 made of CrSi is formed with a specific shape above the element formation region 7a through an oxide film (silicon oxide film) 26 having a specific thickness.

The electrode pad 8 is composed of laminated layers of electrode patterns 28 and 29 that are made of, for instance, aluminum, and disposed above an element formation region 8a through the oxide film 26 formed on the substrate surface. The element formation region 8a is also isolatedly formed in the epitaxial layer 2. The electrode pad 8 can be electrically connected to an external circuit by a bonding step.

The oxide film 26 is disposed on the surface of the various circuit elements 4 to 8 formed inside the substrate 1, and the electrode pattern 28 is formed through an aluminum wiring processing step to correspond to terminals of the circuit elements 4 to 8. The thickness of the electrode pattern 28 is, for instance, about 1.1 μm. The oxide film 26 disposed on the photo diode 4 is a thermally oxidized silicon oxide film.

On the surface of the silicon substrate 1 thus formed, a first TEOS (tetraethoxysilicon) film 31 having a thickness of, for instance, about 200 nm is formed as an insulating film having an electrically insulating property for a flattening treatment. Further, an SOG (Spin-On-Glass) 32 such as BPSG (Boron-Phospho-Silicated Glass) and a second TEOS film 33 having a thickness of, for instance, about 700 nm are laminated with the first TEOS film 31 in this order. Stepped portions produced by the patterning of the aluminum wiring pattern are filled with the SOG 32, and covered with the second TEOS film 33. Accordingly, a flattened surface not having steep steps is provided. The films 31 to 33 constitute an intermediate insulating film 30 in the present embodiment.

A shading film 34 is formed on the flattened second TEOS film 33 to cover the surfaces of the elements such as the IIL element 5 and the bipolar transistor 6 for the signal processing circuits which process signals. The shading film 34 is made of metal including aluminum (Al—Si), and has a thickness of, for instance, 1.3 μm. The electrode pattern 29 constituting the electrode pad 8 is formed and patterned together with the shading film 34. The shading film 34 is electrically connected to the p type isolating diffusion region 3 through an underlying aluminum electrode 28a at a specific part 34a, so that it has an electrical potential substantially equal to that of the substrate 1.

Moreover, a silicon nitride (SiN) film 35 for protection is formed on the shading film 34 to have a thickness of, for instance, about 1.6 μm. Incidentally, the SiN film 35 is not disposed on the surface of the electrode pattern 29. Further, neither the shading film 34 nor the SiN film 35 is disposed on the light receiving surface of the photo diode 4.

The present embodiment has further prominent features described below.

Specifically, as shown in FIG. 1, the intermediate insulating film 30 (31 to 33) remains on the light receiving surface of the photo diode 4 on which neither the SiN film 35 nor the shading film 34 exists. Here, the part of intermediate insulating film 30, which is disposed on the photo diode through the oxide film 26, is referred to as an intermediate insulating film 30a. The intermediate insulating film 30a on the photo diode 4 is covered with light transmittable gel 100 having a refractive index approximately equal to that of the intermediate insulating film 30. Incidentally, since the SOG 32 is provided to fill the step portions produced between the two TEOS films 31 and 33, it does not exist in the flat intermediate insulating film 30a. The intermediate insulating film 30a is composed of the TEOS films 31 and 33.

The refractive index of the intermediate insulating film 30 is about 1.46, and the light transmittable gel 100 is made of silicone gel having a refractive index (for instance, in a range of about 1.0 to 2.13) approximately equal to that of the intermediate insulating film 30. The light transmittable gel 100 also covers the shading film 34 through the SiN film 35, and has a thickness sufficient for protecting an entire surface of the silicon substrate 1 forming a chip. Thus, the gel 100 functions as a protective member for protecting the silicon substrate 1.

The thickness of the light transmittable gel 100 is larger than that of the shading film 34 (for instance, 1.3 μm), and is preferably 100 times or more larger than that of the intermediate insulating film 30a provided on the photo diode 4. For instance, the thickness of the light transmittable gel 100 is about 200 μm. This thick gel 100 fills steps produced between the shading film 34 and the intermediate insulating film 30a on the photo diode 4.

Figure 2:
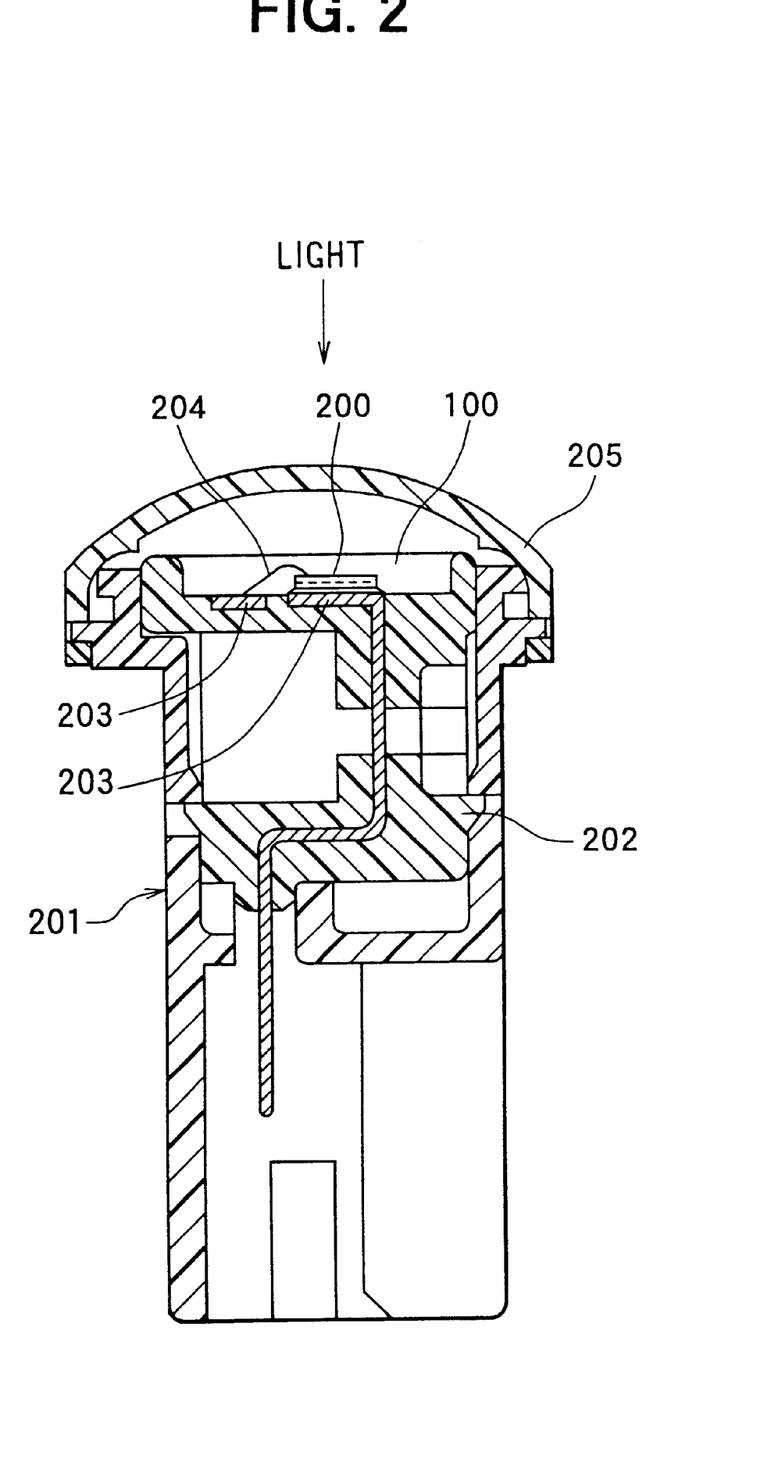
FIG. 2 is a cross-sectional view showing the integrated photo sensor.

The sensor portion 200 provided in the silicon substrate 1 as shown in FIG. 1 is formed into one chip, and then is assembled as shown in FIG. 2 to be used as an integrated photo sensor according to the present invention. The photo sensor is used as, for instance, an on vehicle photo sensor such as a sensor for detecting ambient illuminance to perform ON-OFF control of a vehicle light in accordance with the ambient condition or a sunlight sensor used for automatic air conditioner control.

Referring to FIG. 2, the photo sensor has a connector case 201. The connector case 201 is composed of a case body 202 made of resin such as polyphenylsulfide (PPS) or polybutylene terephthalate (PBT) and a metallic lead frame 203 held in the case body 202. On end (lower end in the figure) of the connector case 201 is to be electrically connected to an external circuit (a vehicle ECU or the like) via a wiring member (not shown) or the like. The other end of the connector case 201 has a recess portion in which the sensor portion 200 is bonded by adhesive or the like to the lead frame 203 exposed from the case body 202.

The electrode pad 8 of the sensor portion 200 is electrically connected to the lead frame 203 via a bonding wire 204. The light transmittable gel 100 is provided to fill the recess portion, thereby sealing and protecting the sensor portion 200. Further, a cover 205 made of light transmittable resin is attached to the case body 202 to cover the gel 100 and the sensor portion 200.

In the integrated photo sensor, light to be detected passes through the cover 205, and is incident the sensor portion 200. The incident light passes through the intermediate insulating film 30a, and is received by the photo diode 4. The photo diode 4 produces photo current (electrical signal) in accordance with an amount of light received therein. The photo current signal is processed by the signal processing circuit elements such has the IIL element 5 and the bipolar transistor 6, and is outputted from the electrode pad 8 to the external circuit through the wire 204 and the lead frame 203.

The sensor portion 200 can be formed generally following a manufacturing method disclosed in JP-A-10-289994. Briefly, first, the circuit elements 4 to 8 such as the photo diode 4, and the oxide film 26 are formed on the silicon substrate 1 by ordinary IC manufacture techniques (ion-implantation, diffusion, and the like). After that, the metallic film made of Al is deposited and is photo-etched, thereby forming the wiring electrode (electrode pattern 28) for the circuit elements.

Next, the intermediate insulating film 30 composed of the first TEOS film 31, the SOG 32, and the second TEOS film 33 is formed. An Al-Si film is then deposited and is photo-etched into a specific pattern as the shading film 34. The SiN film 35 as the protective film is deposited by a CVD method, and a part of the SiN film existing on the light receiving surface of the photo diode 4 is removed by photo-etching and dry-etching.

The thus manufacture silicon substrate 1 is cut into individual chips. One of the chips, the sensor portion 200, is adhered to the lead frame 203 of the connector case by adhesive. Then, the electrode pad 8 of the sensor portion 200 is electrically connected to the lead frame 203 by wire bonding. After that, the light transmittable gel 100 is applied to the sensor portion 200. After a heat treatment is carried out, the cover 205 is adhered to the case body 202. As a result, the integrated photo sensor is completed as shown in FIG. 2.

According to the present embodiment described above, the light transmittable gel 100 having a refractive index approximately equal to that of the intermediate insulating film 30 is provided on the photo diode (light-receiving element) 4, with a thickness sufficient for preventing interference of light. The light transmittable gel 100 also covers the shading film 34 (the SiN film 35) with the thickness sufficient for covering the entire surface of the silicon substrate 1 as one chip, while filling the steps produced between the shading film 34 and the intermediate insulating film 30a on the photo diode 4.

This thick light transmittable gel 100 effectively restricts interference of incident light that can cause variations in optical characteristics. That is, if the film is as thin as the P—$SiO_2$ film disclosed in JP-A-8-32045, variation in thickness affects the optical characteristics. As opposed to this, since the light transmittable gel 100 can be thickened sufficiently, it hardly affects the optical characteristics even when the thickness of the gel 100 varies to some extent.

Furthermore, since the gel 100 can be thickened sufficiently for preventing interference, the thickness of the intermediate insulating film 30a disposed on the photo diode 4 can be increased. In addition, the optical characteristics are hardly affected by the variation in thickness of the intermediate insulating film 30a. Unlike a conventional sensor, it is not necessary to perform the step for removing the intermediate insulating film on the light-receiving element, resulting in low manufacture cost. The gel 100 does not necessitate a deposition apparatus as being used for forming the conventional P—$SiO_2$ film. The gel 100 can be formed on the intermediate insulating film 30a readily by coating.

Thus, the present embodiment adopts the structure including the photo diode 4 made of silicon on which the silicon oxide film composed of the oxide film 26 and the intermediate insulating film 30a, and the light transmittable gel (silicone gel) 100 are laminated in this order. The gel 100 can be formed with a large thickness readily by coating. As a result, the integrated photo sensor capable of preventing the variations in the optical characteristics is provided. These effects and features are further specifically explained below.

Transmittance T of light passing through silicon constituting the photo diode 4 when the light is incident from the upper side of the light-receiving element is represented by formula (1) of:

$$T = a/(b + c \cdot \cos(2\lambda \cdot n_1 \cdot d)) \quad (1)$$

in which $\lambda$ is a wave length of incident light, d is a thickness of the silicon oxide film, and $n_1$, is a refractive index of the silicon oxide film which corresponds to the oxide film 26 and the intermediate insulating film 30*a* in the present embodiment. The oxide film 26 and the intermediate insulating film 30*a* are silicon oxide films respectively, although their manufacturing methods are different from each other. Therefore, both the oxide film 26 and the intermediate insulating film 30*a* can be considered to have the same refractive index $n_1$. Further, a, b, and c in the formula (1) can be represented by the following formulas (2), (3), and (4).

$$a = 8 n_0 \cdot n_1^2 \cdot n_2 \quad (2)$$

$$b = (n_0^2 + n_1^2)(n_1^2 + n_2^2) + 4 n_0 \cdot n_1^2 \cdot n_2 \quad (3)$$

$$c = (n_0^2 - n_1^2)(n_1^2 - n_2^2) \quad (4)$$

in which $n_2$ is a refractive index of silicon corresponding to the photo diode 4, and $n_0$ is a refractive index of substance disposed on the silicon oxide film, corresponding to the light transmittable gel 100 in the present embodiment.

Figure 3:
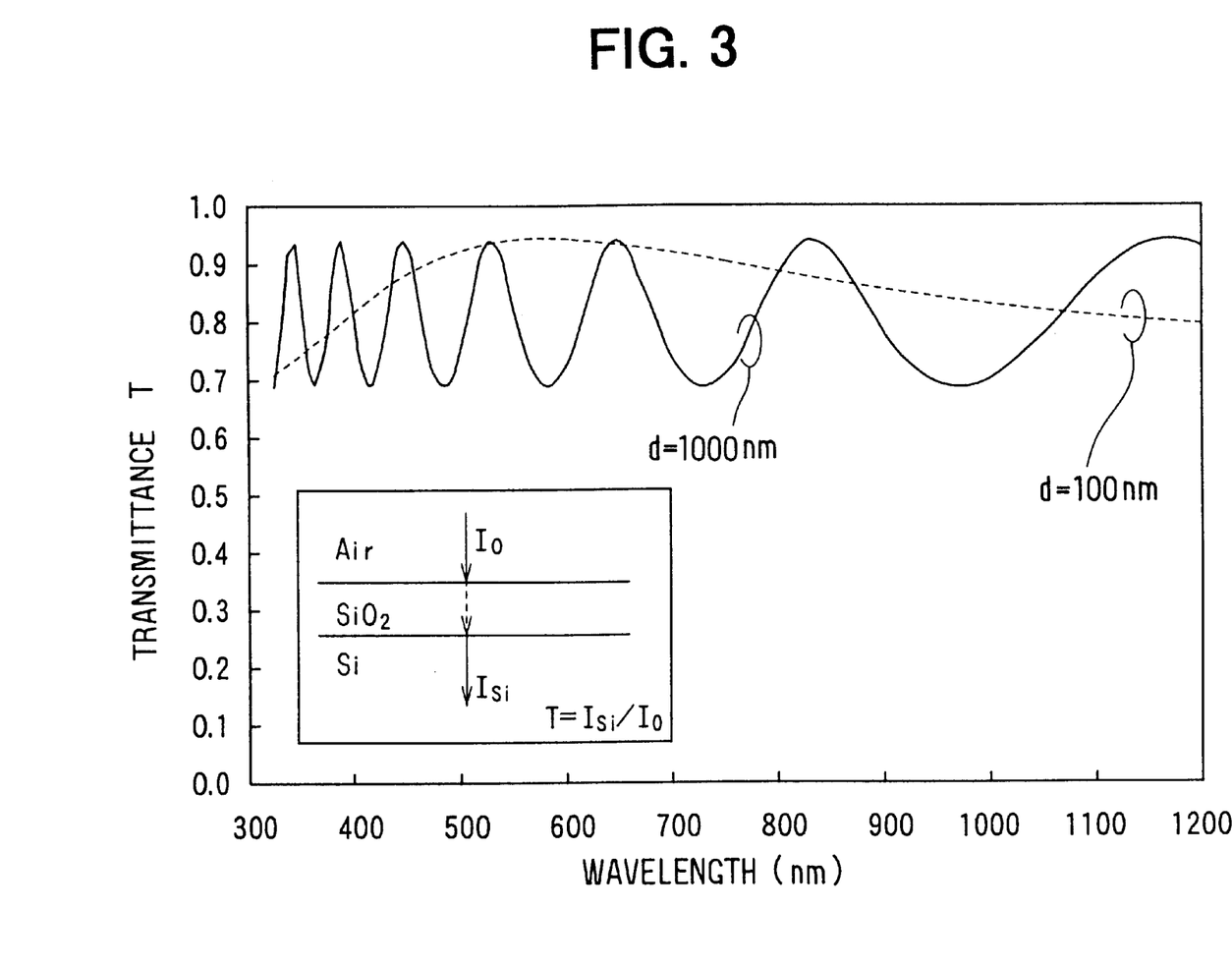
FIG. 3 is a graph showing a wavelength depending property of transmittance in a comparative example in which substance disposed on a silicon oxide film is air.

First, transmittance T in a case where the substance on the silicon oxide film is air having a refractive index of 1 (i.e., the light transmittable gel 100 does not exist) is calculated as a comparative example using the formulas (1) to (4) above. The result is shown in FIG. 3. Here, refractive index $n_2$ of silicon is set at 3.45, and refractive index $n_1$ of the silicon oxide film is set at 1.46. FIG. 3 shows depending properties of transmittance T with respect to wavelength $\lambda$ (unit: nm) of irradiation light in cases where thickness d of the silicon oxide film is 1000 nm (solid line) and where thickness d is 100 nm (broken line). Accordingly, it is revealed that transmittance T largely changes when thickness d of the silicon oxide film is large.

The change in transmittance T varies the amount of light detected by the light-receiving element to cause variation in detecting property of light intensity. In addition, since transmittance T changes in accordance with the wavelength of light, the detected light intensity changes in accordance with the wavelength even when the real light intensity is constant. Especially, in an illuminance detecting sensor or a sunlight sensor for detecting various kinds of light such as sunlight existing outside vehicles, the transmittance largely depending on the wavelength is a problem. In the comparative example, the thickness of the silicon oxide film must be reduced to be approximately 100 nm, and must be controlled accurately to decrease the change in transmittance T.

Figure 4:
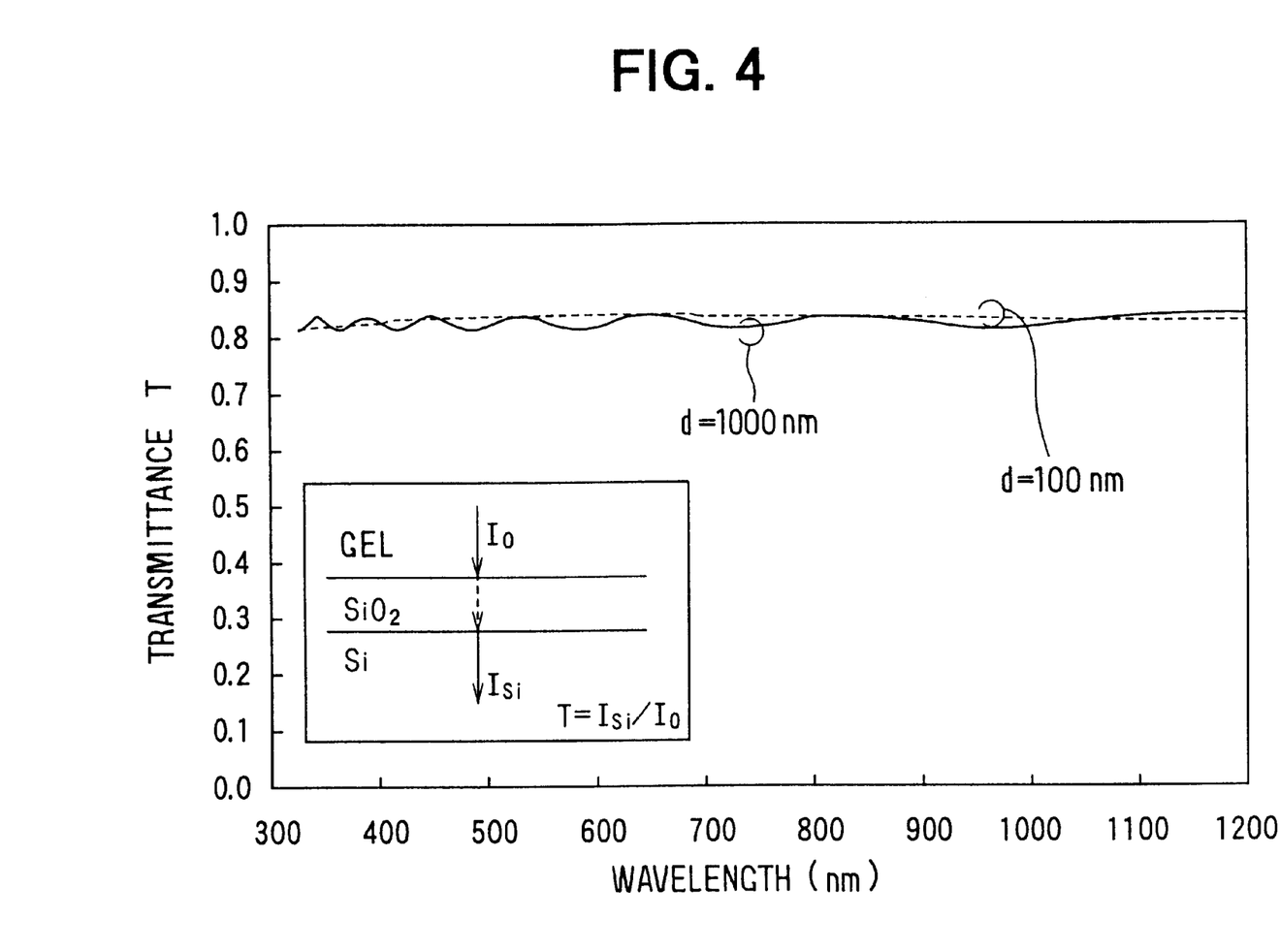
FIG. 4 is a wavelength depending property of transmittance in the present embodiment in which light transmittable gel is disposed on the silicon oxide film.

To the contrary, FIG. 4 shows transmittance T calculated using the formulas (1) to (4) in the case where the light transmittable gel 100 is formed on the silicon oxide films 26 and 30*a* according to the present embodiment. Silicone gel having a refractive index of 1.41 is used as the light transmittable gel 100 for the calculation. Refractive index $n_2$ of silicone is set at 3.45, and refractive index $n_1$ of the silicon oxide film is set at 1.46 similarly to the above comparative example.

FIG. 4 shows depending properties of transmittance T with respect to wavelength (unit:nm) of irradiation light in cases where thickness d of the silicon oxide film is 1000 nm (solid line) and thickness d is 100 nm (broken line). Accordingly, it is confirmed that the change in transmittance T in the present embodiment is very small even when thickness d of the silicon oxide film is large in comparison with the comparative example.

Because of this, the silicon oxide film 26, 30*a* provided on the light-receiving element (photo diode 4) needs not be thinned, and the intermediate insulating film and the like on the light-receiving element need not be removed. The variation in thickness of the silicon oxide film existing on the light-receiving element hardly affects the change in transmittance. Therefore, the thickness of the silicon oxide film needs not be controlled accurately.

In the formula (1), the value of $\cos(2\lambda \cdot n_1 \cdot d)$ on the right side changes between $-1$ and $+1$ in accordance with values of $\lambda$, $n_1$, and d. Therefore, as represented by formulas (5), (6), and (7) below, the minimum value Tmin and the maximum value Tmax of transmittance T can be determined, and variation $\Delta T$ in transmittance T, which is caused by the changes in wavelength $\lambda$, thickness d, and the like, can be determined by the minimum value Tmin and the maximum value Tmax.

$$Tmin = a/(b + C) \quad (5)$$

$$Tmax = a/(b - C) \quad (6)$$

$$\Delta T = |Tmax - Tmin| \quad (7)$$

Figure 5:
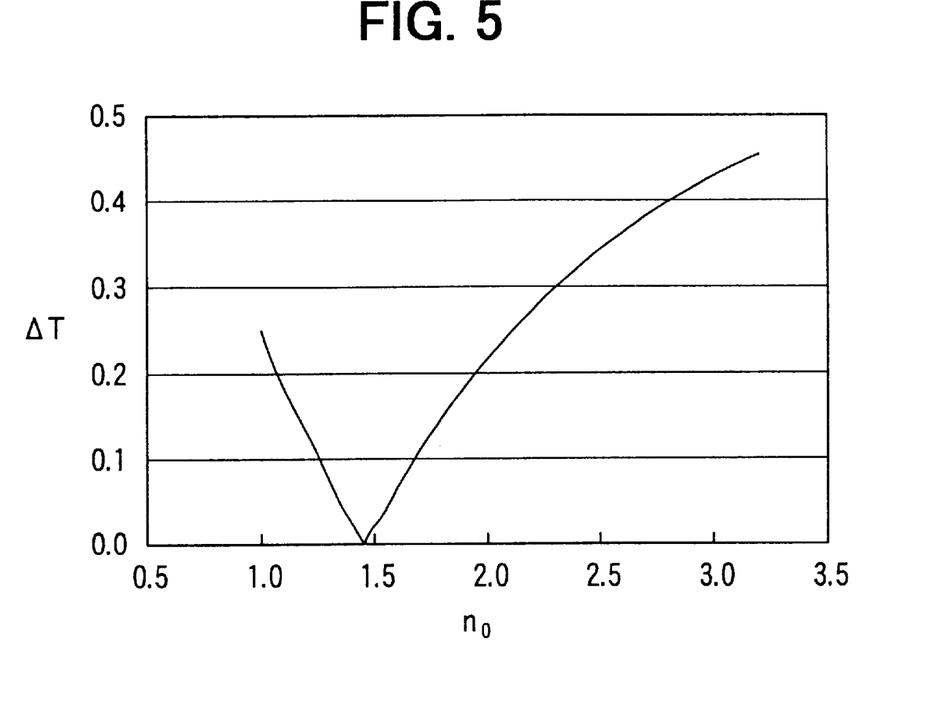
FIG. 5 is a graph showing a change in transmittance of a light-receiving element with respect to a refractive index of a substance disposed on the silicon oxide film.

FIG. 5 shows the change in variation $\Delta T$ with respect to the refractive index $n_0$ of substance provided on the silicon oxide film. As understood from FIG. 5, when the refractive index $n_0$ of the substance on the silicon oxide film (corresponding to the light transmittable gel 100) is equal to the refractive index $n_1$ of the silicon oxide film (substantially corresponding to the refractive index of the intermediate insulating film 30, and 1.46 in the present embodiment), i.e., when $n_0 = n_1$, the variation in transmittance becomes minimum. A preferable range of the refractive index $n_0$ of the light transmittable gel 100 is approximately 1 to 2.13 so that the variation in transmittance is small as compared to the case where air ($n_{0=1}$) exists instead of the gel 100.

Figure 6:
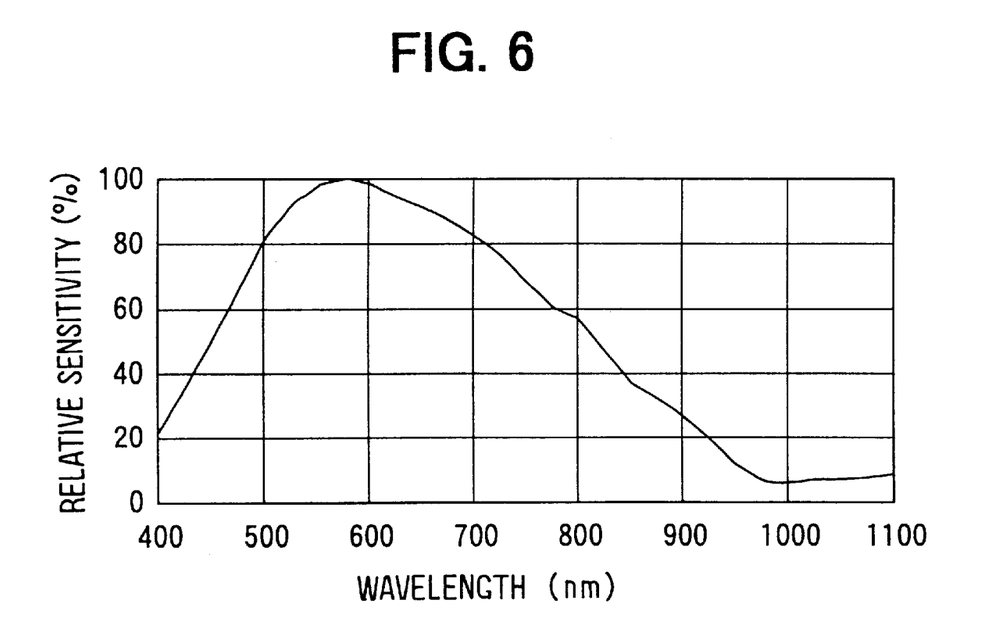
FIG. 6 is a graph showing a wavelength depending property of relative sensitivity in a case where a silicon oxide film is disposed on a photo diode to have a thickness of 270 nm and no silicone gel is formed.
Figure 7:
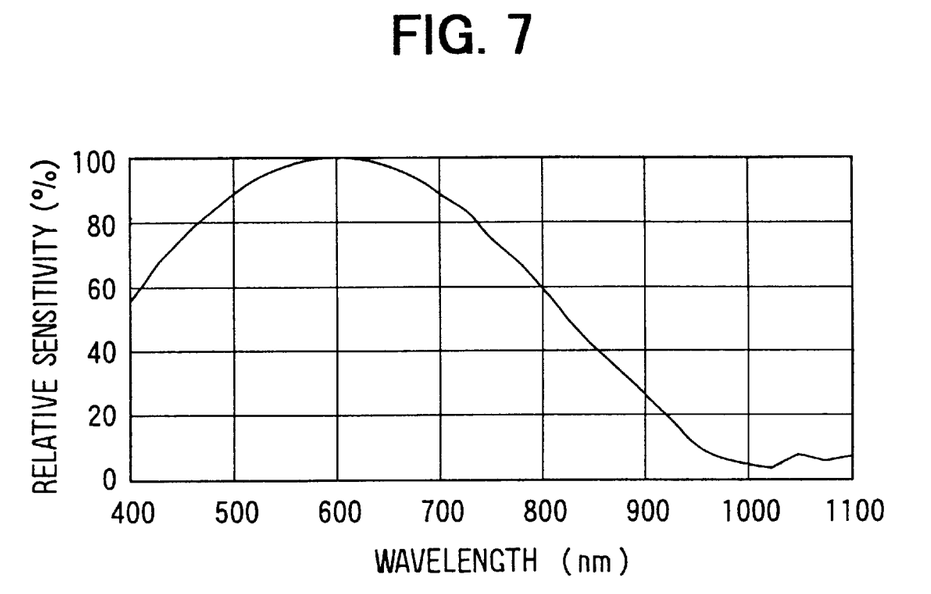
FIG. 7 is a graph showing a wavelength depending property of relative sensitivity in a case where a silicon oxide film is disposed on a photo diode to have a thickness of 270 nm and silicone gel is formed to have a thickness of 200 $\mu$m.

Next, the effects of the present embodiment are explained referring to FIGS. 6 to 9 based on experimental results. FIGS. 6 to 9 respectively show sensor sensitivities (relative sensitivities) with respect to wavelength of light. Specifically, FIG. 6 is obtained from a sample in which the silicon oxide film 26, 30*a* is formed on the photo diode 4 to have a thickness of 270 nm, and no silicone gel (light transmittable gel 100) is formed. FIG. 7 is obtained from a sample in which the silicon oxide film 26, 30*a* is formed on the photo diode 4 to have a thickness of 270 nm, and the silicone gel is formed to have a thickness of 200 μm.

Figure 8:
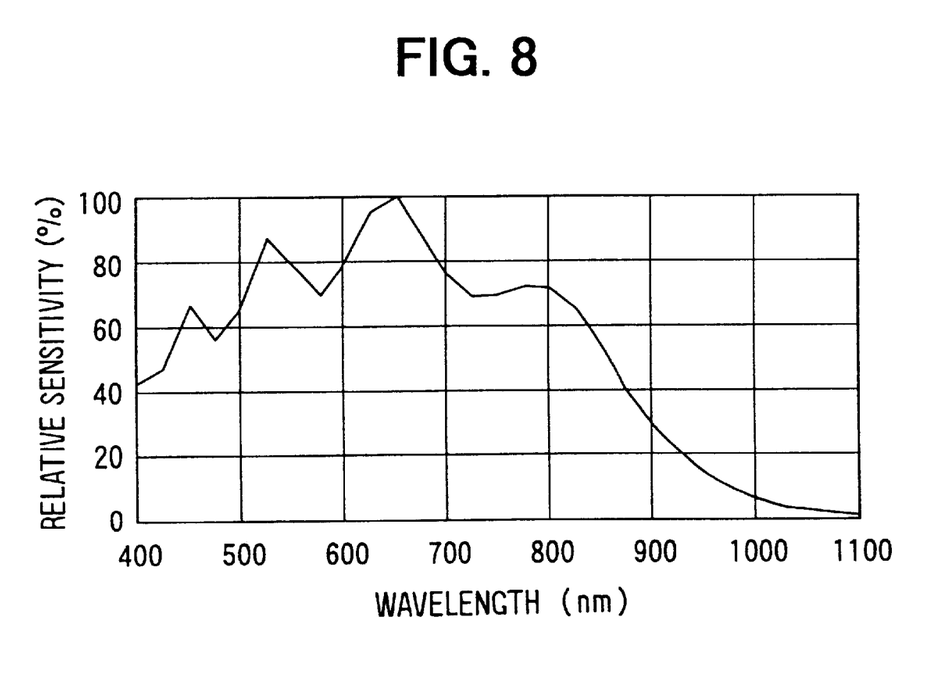
FIG. 8 is a graph showing a wavelength depending property of relative sensitivity in a case where a silicon oxide film is disposed on a photo diode to have a thickness of 1010 nm and no silicone gel is formed.
Figure 9:
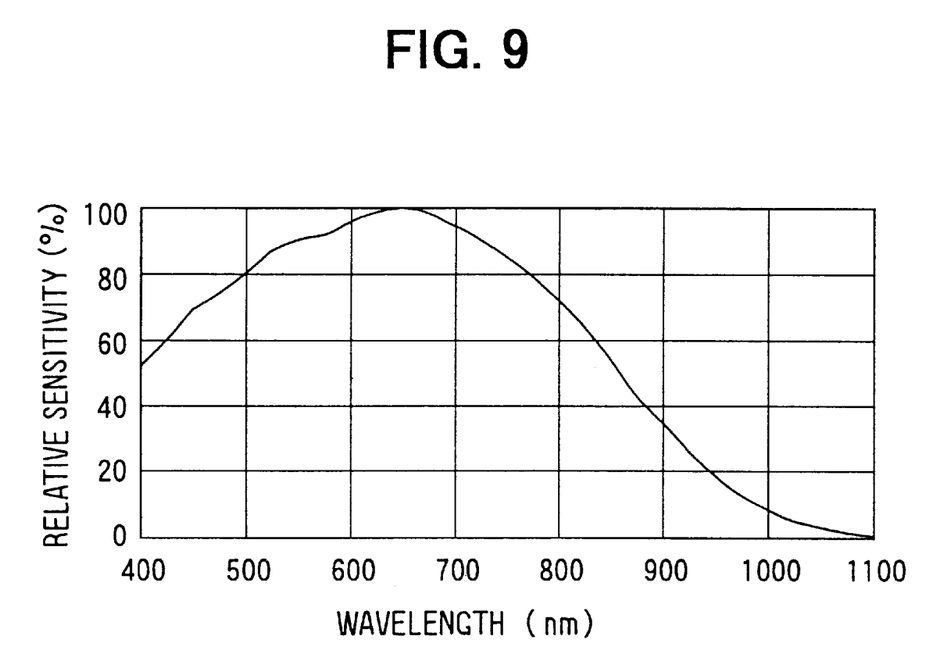
FIG. 9 is a graph showing a wavelength depending property of relative sensitivity in a case where a silicon oxide film is disposed on a photo diode to have a thickness of 1010 nm and silicone gel is formed to have a thickness of 200 $\mu$m.

FIG. 8 is obtained from a sample in which the silicon oxide film 26, 30*a* is formed on the photo diode 4 to have a thickness of 1010 nm, and no silicone gel is formed. FIG. 9 is obtained from a sample in which the silicon oxide film 26, 30*a* is formed on the photo diode 4 to have a thickness of 1010 nm, and the silicone gel is formed to have a thickness of 200 μm. In FIGS. 6 to 9, refractive indexes $n_2$, $n_1$, and $n_0$ of the photo diode 4, the silicon oxide film, and the silicone gel are 3.45, 1.46, and 1.41, respectively.

As understood by comparing FIG. 6 with FIG. 8, the thinner the silicon oxide film 26, 30*a* is, the higher the sensor sensitivity becomes even when there is no light transmittable gel 100. However, when the silicon oxide film 26, 30*a* is thin as in the sample for FIG. 6, the removal step of the oxide film on the light-receiving element must be performed, resulting in increased manufacturing cost. Also, when the oxide film is thick and left on the light-receiving element as in the sample for FIG. 8, the light receiving property (sensor sensitivity) has variation in accordance to the change in wavelength of light.

On the other hand, in the case where the light transmittable gel 100 is formed with a thick thickness as compared to that of the silicon oxide film 26, 30a, as in the samples for FIGS. 7 and 9, good sensitivities are provided regardless of the thickness of the silicon oxide film 26, 30a. Here, the thickness of the light transmittable gel 100 is preferably 100 times or more, and more preferably 200 times or more thicker than that of the silicon oxide film 26, 30a (substantially than that of the intermediate insulating film 30a). In FIG. 9, the thickness of the gel 100 is approximately 200 times thicker than that of the oxide film.

Also, the thickness of the light transmittance gel 100 is preferably larger than approximately 500 nm so that interference is reduced sufficiently. The appropriate upper limit thickness of the light transmittance gel 100 is approximately 5 $\mu$m (=5000 nm) in view of productivity and the like.

In the embodiment described above, although the silicon oxide film is used as the intermediate insulating film 30a disposed on the light-receiving element, the same effects can be achieved when a silicon nitride film is used as well. In such a case, it is preferable that the refractive index of the silicon nitride film is approximately 2 and the refractive index $n_0$ of the light transmittable gel 100 is in a range of approximately 1 to 4. Accordingly, the transmittance can be reduced in comparison with the case where there is no gel 100, i.e., air ($n_{0=1}$) exists instead of the gel 100. Fluorine gel, phlorosilicone gel, or the like may be used as the gel 100.

Also, in the embodiment described above, the intermediate insulating film 30a disposed on the light-receiving element 4 is directly covered with the light transmittable gel 100 having a refractive index approximately equal to that of the intermediate insulating film 30 (30a). However, a film such as an $SiO_2$ film having a refractive index approximately equal to that of the intermediate insulating film 30a may be interposed between the gel 100 and the intermediate insulating film 30a.

The light transmittable gel 100 may not cover the regions such as the shading film 34 other than the light-receiving element 4 so long as it covers at least the intermediate insulating film 30a disposed on the light-receiving element. The steps produced between the shading film 34 and the intermediate insulating film 30a need not always be filled with the light transmittable gel 100 provided that the gel 100 has a thickness sufficient for preventing interference of light.

While the present invention has been shown and described with reference to the foregoing preferred embodiment, it will be apparent to those skilled in the art that changes in form and detail may be made therein without departing from the scope of the invention as defined in the appended claims.

What is claimed is:

1. An integrated photo sensor comprising:

a chip;

a light-receiving element provided on the chip for receiving light and converting an amount of the light into an electrical signal;

a signal processing circuit element provided on the chip separately from the light-receiving element, for processing the electrical signal from the light-receiving element;

a shading film provided on the chip to cover the signal processing circuit element and having a window corresponding to a light receiving region on the light-receiving element;

an intermediate insulating film provided between the chip and the shading film, the intermediate insulating film extending on the signal processing circuit element and on the light-receiving element; and a light transmittable gel provided on the light-receiving element through the intermediate insulating film, the light transmittable gel having a refractive index approximately equal to that of the intermediate insulating film.

2. The integrated photo sensor of claim 1, wherein the light transmittable gel covers the shading film and has a thickness sufficient for protecting the chip.

3. The integrated photo sensor of claim 1, wherein the light transmittable gel has a thickness that is at least 100 times thicker than that of the intermediate insulating film provided on the light-receiving element.

4. The integrated photo sensor of claim 1, wherein:

the light-receiving element is made of silicon; and the intermediate insulating film is made of silicon oxide.

5. The integrated photo sensor of claim 4, wherein the refractive index of the light transmittable gel is in a range of approximately 1 to 2.13.

6. The integrated photo sensor of claim 1, wherein:

the light-receiving element is made of silicon; and the intermediate insulating film is made of silicon nitride.

7. The integrated photo sensor of claim 6, wherein the refractive index of the light transmittable gel is in a range of approximately 1 to 4.

8. The integrated photo sensor of claims 1, wherein the light transmittable gel has a thickness larger than approximately 500 nm.

9. An integrated photo sensor comprising:

a chip;

a light-receiving element provided on the chip for receiving light and converting an amount of the light into an electrical signal;

a signal processing circuit element provided on the chip separately from the light-receiving element, for processing the electrical signal from the light-receiving element;

a shading film provided on the chip to cover a surface of the chip other than a light receiving region of the light-receiving element;

an intermediate insulating film including a first part disposed on the signal processing circuit element between the chip and the shading film, and a second part disposed on the light receiving region of the light-receiving element; and a light transmittable gel provided on the light-receiving element through the intermediate insulating film, the light transmittable gel being thicker than the shading film and filling a step produced between the shading film and the second part of the intermediate insulating film.

10. The integrated photo sensor of claim 9, wherein the light transmittable gel covers the shading film and has a thickness sufficient for protecting the chip.

11. The integrated photo sensor of claim 9, wherein the light transmittable gel has a thickness that is at least 100 times thicker than that of the second part of the intermediate insulating film provided on the light-receiving element.

12. The integrated photo sensor of claim 9, wherein:
the light-receiving element is made of silicon; and
the intermediate insulating film is made of silicon oxide.

13. The integrated photo sensor of claim 12, wherein the light transmittable gel has a refractive index in a range of approximately 1 to 2.13.

14. The integrated photo sensor of claim 9, wherein:
the light-receiving element is made of silicon; and
the intermediate insulating film is made of silicon nitride.

15. The integrated photo sensor of claim 14, wherein the light transmittable gel has a refractive index in a range of approximately 1 to 4.

16. The integrated photo sensor of claim 9, wherein the light transmittable gel has a thickness larger than approximately 500 nm.

* * * * *

UNITED STATES PATENT AND TRADEMARK OFFICE
CERTIFICATE OF CORRECTION

PATENT NO.    : 6,333,544 B1  Page 1 of 1
DATED         : December 25, 2001
INVENTOR(S)   : Inao Toyoda and Yoshitaka Gotoh It is certified that error appears in the above-identified patent and that said Letters Patent is hereby corrected as shown below:

<u>Title page,</u>
Item [75], Inventors, correct the second inventor's residence "Toyotake" to be -- Toyoake --

Signed and Sealed this

Ninth Day of September, 2003

JAMES E. ROGAN
*Director of the United States Patent and Trademark Office*